United States Patent [19]
Son

[11] Patent Number: 6,063,681
[45] Date of Patent: May 16, 2000

[54] SILICIDE FORMATION USING TWO METALIZATIONS

[75] Inventor: Jeong Hwan Son, Taejeon-si, Rep. of Korea

[73] Assignee: LG Semicon Co., Ltd., Chungcheongbuk-do, Rep. of Korea

[21] Appl. No.: 09/118,823

[22] Filed: Jul. 20, 1998

[30] Foreign Application Priority Data

Jan. 13, 1998 [KR] Rep. of Korea .......................... 98/738

[51] Int. Cl.⁷ .................................................. H01L 21/336
[52] U.S. Cl. ........................ 438/303; 438/305; 438/366; 438/533; 438/542; 438/595; 438/630; 438/652; 438/656; 438/682; 438/231
[58] Field of Search ..................... 438/303, 305, 438/365, 366, 369, 533, 542, 553, 564, 585, 595, 630, 648, 652, 656, 682, 683, 230, 231, 233

[56] References Cited

U.S. PATENT DOCUMENTS

| | | |
|---|---|---|
| 5,512,502 | 4/1996 | Ootsuka et al. . |
| 5,646,070 | 7/1997 | Chung . |
| 5,710,450 | 1/1998 | Chau et al. . |
| 5,851,921 | 12/1998 | Gardner et al. . |
| 5,920,783 | 7/1999 | Tseng et al. . |
| 5,930,617 | 7/1999 | Wu . |
| 5,950,098 | 9/1999 | Oda et al. . |
| 5,953,614 | 9/1999 | Liu et al. . |
| 5,956,584 | 9/1999 | Wu . |
| 5,972,764 | 10/1999 | Huang et al. . |
| 5,989,950 | 11/1999 | Wu . |
| 5,998,273 | 12/1999 | Ma et al. . |

OTHER PUBLICATIONS

T. Yoshitomi, et al, "Silicided Silicon–Sidewall Source and Drain (S D) Structure for High–Performance 75–nm Gate Length pMOSFETs," 1995 Symposium on VLSI Technology, pp. 11–12.

*Primary Examiner*—John F. Niebling
*Assistant Examiner*—Jonathan Hack

[57] ABSTRACT

Semiconductor device and method for fabricating the same, is disclosed, in which LDD regions and source/drain regions are provided with a silicide for reducing resistances to prevent short channel, the device including a gate insulating film and a gate electrode formed stacked on a prescribed region of a semiconductor substrate, sidewall spacers formed at both sides of the gate insulating film and the gate electrode, first impurity regions formed in surfaces of the semiconductor substrate under the sidewall spacers, second impurity regions formed in the semiconductor substrate on both sides of the sidewall spacers and the first impurity regions, first silicide films at surfaces of the first impurity regions, and second silicide films at surfaces of the gate electrode and the second impurity regions.

15 Claims, 10 Drawing Sheets

SILICIDE FORMATION USING TWO METALIZATIONS

BACKGROUND OF THE INVENTION

1. Field of the Invention

The present invention relates to a semiconductor device, and more particularly, to a semiconductor device and a method for fabricating the same, in which LDD(Lightly Doped Drain) regions and source/drain regions are provided with a silicide for reducing resistances to prevent short channel.

2. Discussion of the Related Art

A background art semiconductor device will be explained with reference to the attached drawings. FIG. 1 illustrates a section of the background art semiconductor device.

The background art semiconductor device is provided with a trench formed in a field region of a semiconductor substrate 1 having an active region and a field region defined thereon, in which an isolating oxide film 2 is formed. There is a gate oxide film 3, a gate electrode 4 and a gate cap silicide film 5a stacked on the active region. There are sidewall spacers 6 formed at both sides of the gate oxide film 3, the gate electrode 4 and the gate cap silicide film 5a. There are LDD regions 7 at surfaces of the semiconductor substrate 1 under the sidewall spacers 6 and source/drain regions 8 in surfaces of the semiconductor substrate 1 in the active region on opposite sides of the sidewall spacers 6 and the LDD regions 7. And, there are silicide films 5b formed in surfaces of the source/drain regions 8.

The aforementioned semiconductor device has the following problems.

Despite of the reduced resistance by the silicide formed in the source/drain regions, the great resistance of the LDD regions causes short channel in which an excessive current flows, that degrades a device operation reliability.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same, which can prevent short channel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a gate insulating film and a gate electrode formed stacked on a prescribed region of a semiconductor substrate, sidewall spacers formed at both sides of the gate insulating film and the gate electrode, first impurity regions formed in surfaces of the semiconductor substrate under the sidewall spacers, second impurity regions formed in the semiconductor substrate on both sides of the sidewall spacers and the first impurity regions, first silicide films at surfaces of the first impurity regions, and second silicide films at surfaces of the gate electrode and the second impurity regions.

In other aspect of the present invention, there is provided a method for fabricating a semiconductor device, including the steps of (1) forming a stack of gate insulting film and a gate electrode over a semiconductor substrate, (2) forming first sidewall spacers at both sides of the stack of the gate insulating film and the gate electrode, (3) forming first impurity regions using the first sidewall spacers as masks, (4) depositing a first metal layer on an entire surface, (5) annealing the first metal layer, to form first silicide films in surfaces of the first impurity regions and the gate electrode, (6) removing the first metal layer which made no reaction, (7) forming second sidewall spacers at sides of the first sidewall spacers at sides of the stack of the gate insulting film and the gate electrode, (8) forming source/drain regions in the semiconductor substrate using the second sidewall spacers as masks, (9) depositing a second metal layer on an entire surface, (10) conducting annealing to form second silicide films on the gate electrode and the source/drain regions, and (11) removing the second metal layer which made no reaction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
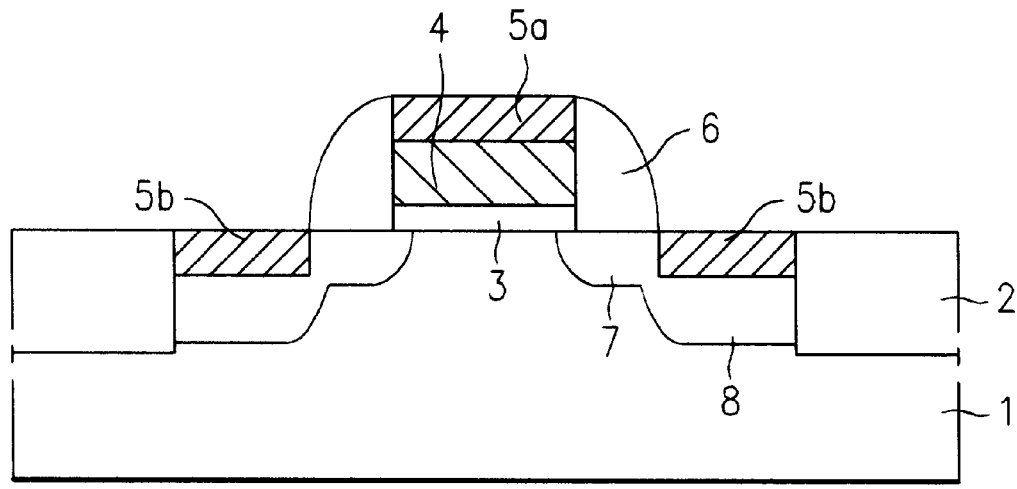
FIG. 1 illustrates a section of a background art semiconductor device.
Figure 2:
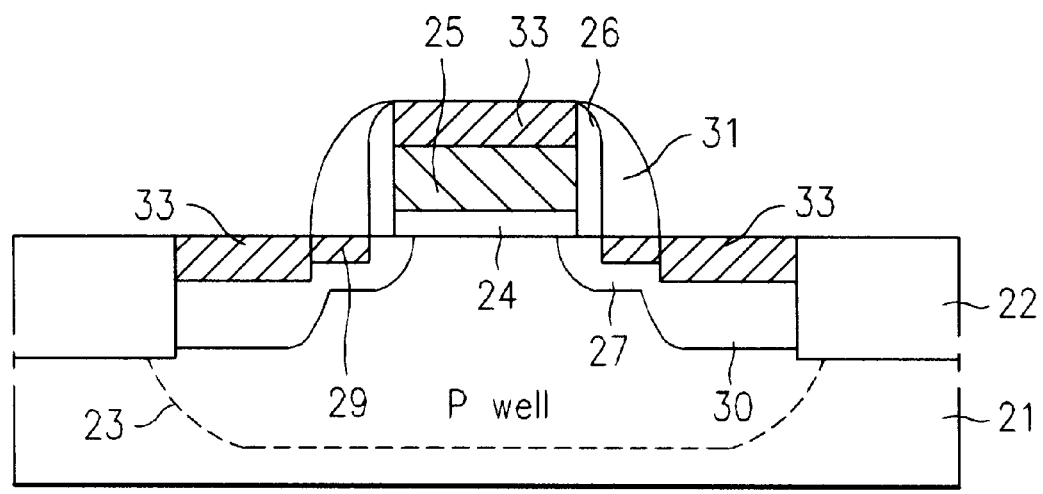
FIG. 2 illustrates a section of a semiconductor device in accordance with a preferred embodiment of the present invention.

Reference will now be made in detail to the preferred embodiments of the present invention, examples of which are illustrated in the accompanying drawings. FIG. 2 illustrates a section of a semiconductor device in accordance with a preferred embodiment of the present invention, FIGS. 3A~3H illustrates sections showing the process steps of a method for fabricating a semiconductor device in accordance with a first preferred embodiment of the present invention, FIGS. 4A~4I illustrates sections showing the process steps of a method for fabricating a semiconductor device in accordance with a second preferred embodiment of the present invention, and FIGS. 5A~5G illustrates sections showing the process steps of a method for fabricating a semiconductor device in accordance with a third preferred embodiment of the present invention.

Referring to FIG. 2, the semiconductor device in accordance with a preferred embodiment of the present invention includes a P well 23 formed in an active region in a semiconductor substrate 21 having a field region and an active region defined thereon. There are a trench region formed in the field region and an isolating insulating film 22 formed in the trench region flat to a surface of the semiconductor substrate 21. And, there are a gate oxide film 24, a gate electrode 25 and a second metal silicide 33 stacked over a region of the P well 23. There are LDD regions 27 formed in the P well 23 on both sides of the gate oxide film 24, the gate electrode 25 and the second metal silicide 33. And, there are thin first sidewall spacers 26 at both sides of the gate oxide film 24, the gate electrode 25 and the second metal silicide 33 and second sidewall spacers 31 on the first sidewall spacers 26. There are source/drain regions 30 in the P well 23 on both sides of the second sidewall spacers 31 and second metal silicide 33 in surfaces of the source/drain regions 30. And, there are first metal silicide 29 under the second sidewall spacers to depths less than depths of the second metal silicide 33. The LDD regions 27 are formed to a depth of 50018 1000 Å, the source/drain regions 30 to a depth of 1000~2000 Å. And, the first metal silicide 29 is formed to a depth of 200~400 Å, and the second metal silicide 33 is formed to a depth of 500~800 Å, deeper than the first metal silicide 29.

A method for fabricating a semiconductor device in accordance with a first embodiment of the present invention will be explained.

Figure 3A:
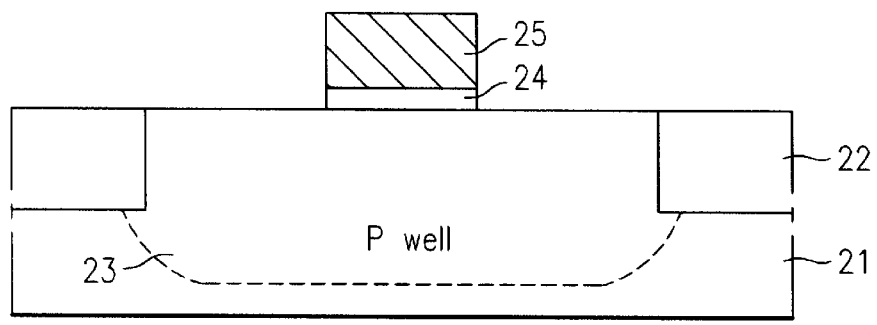
FIGS. 3A~3H illustrates sections showing the process steps of a method for fabricating a semiconductor device in accordance with a first preferred embodiment of the present invention.
Figure 3B:
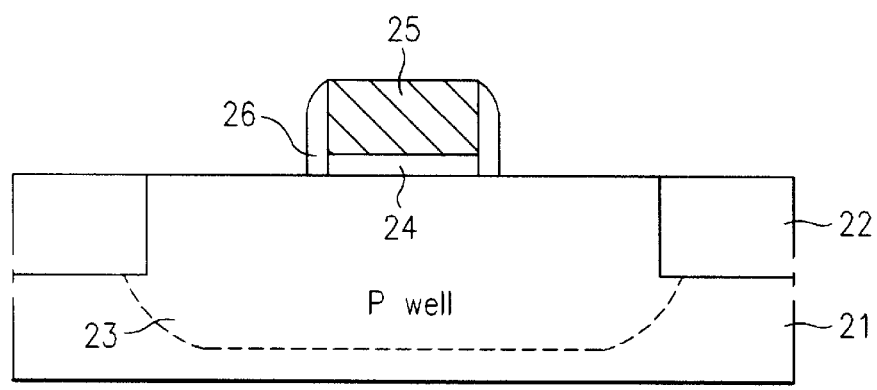
Figure 3C:
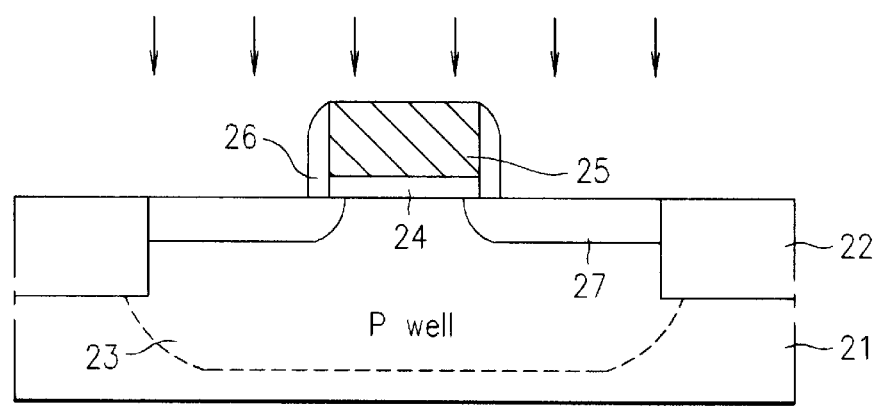
Figure 3D:
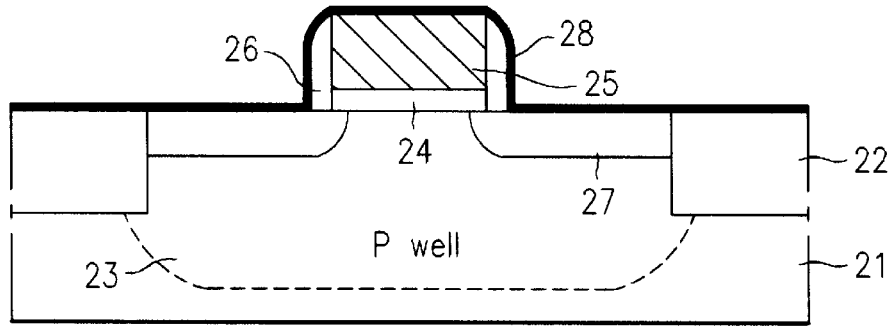
Figure 3E:
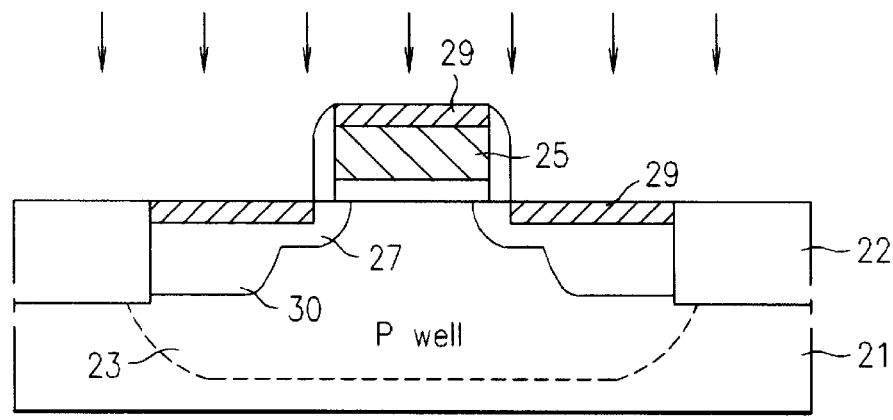
Figure 3F:
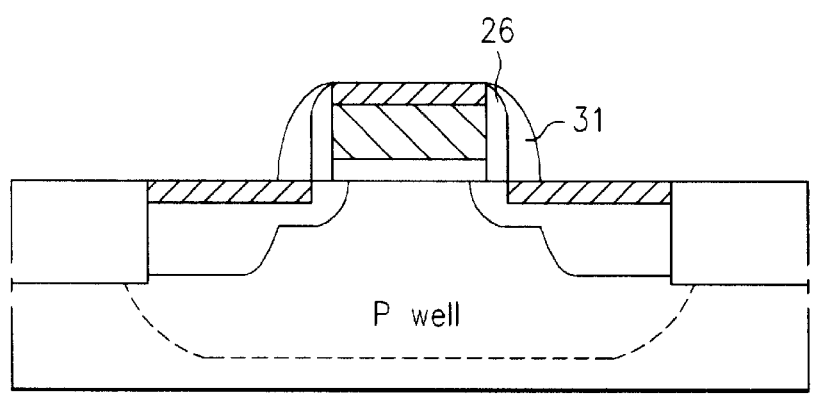
Figure 3G:
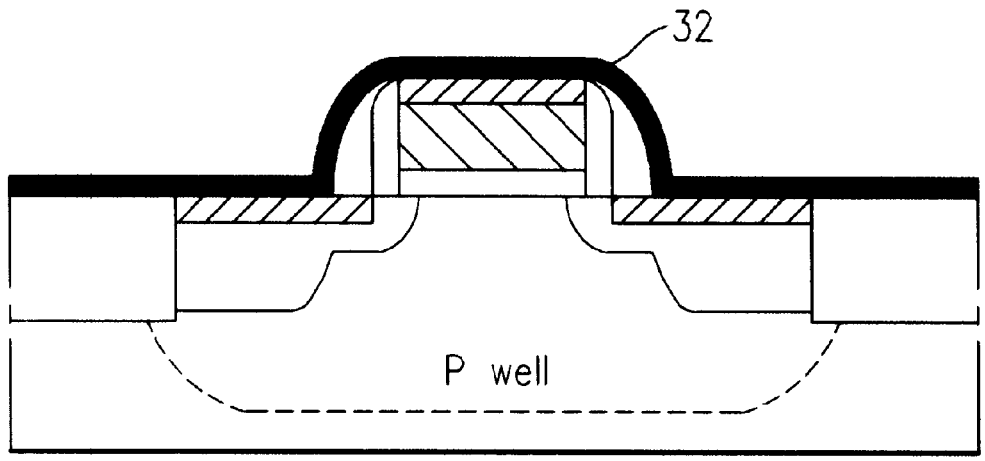
Figure 3H:
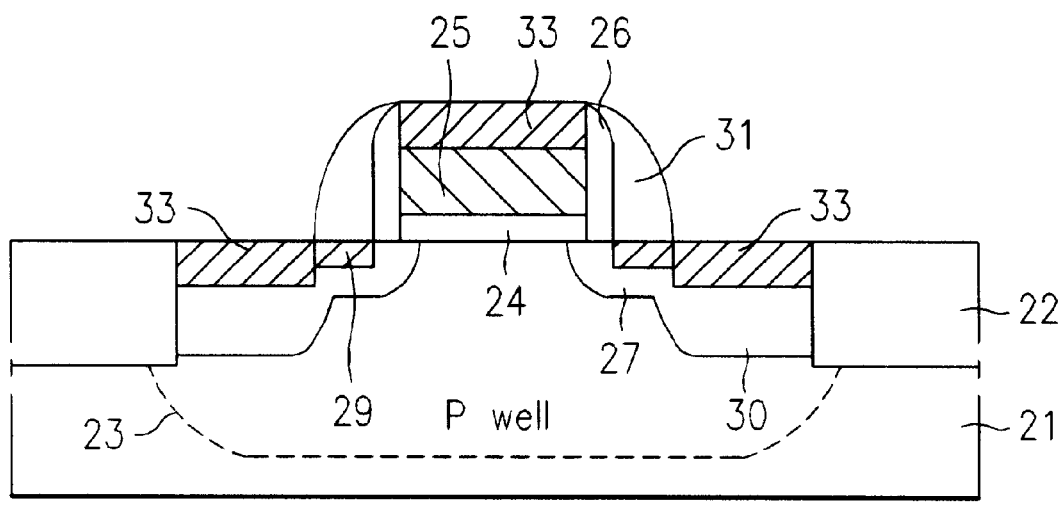

Referring to FIG. 3A, the method for fabricating a semiconductor device in accordance with a first preferred embodiment of the present invention starts with forming trenches(not shown) in field regions of an N type semiconductor substrate 21 having an active region and the field regions defined therein. A first oxide film is deposited on the semiconductor substrate 21 to cover the trenches and subjected to chemical mechanical polishing to make the first oxide film flat to the semiconductor substrate 21, to form isolating insulating films 22. P type boron ions injected into the active region to form a P well 23 therein. Then, ions are injected into the active region in the P well 23 for adjusting a channel threshold voltage. A second oxide film and a doped silicon layer are deposited on the semiconductor substrate 21 in succession and etched anisotropicially using a mask to form a gate, to form a gate oxide film 24 and a gate electrode 25. The first silicon layer may be doped as it is deposited, or after completion of the deposition by injecting ions. As shown in FIG. 3B, after subjecting the semiconductor substrate 21 to thermal oxidation to form a thin film on an entire surface of the semiconductor substrate 21 or after depositing a thin third oxide film or a nitride film, the film is subjected to anisotropic etching, to form first sidewall spacers 26 at both sides of the gate oxide film 24 and the gate electrode 25 to a thickness ranging 100~500 Å. As shown in FIG. 3C, the semiconductor substrate 21 on both sides of the gate electrode 25 and the first sidewall spacers 26 is lightly doped with N type impurity ions to form LDD regions 27 therein. As shown in FIG. 3D, a first metal layer 28 is deposited on an entire surface of the semiconductor substrate 21 to a thickness ranging 100~200 Å. As shown in FIG. 3E, the first metal layer 28 formed on the entire surface is annealed to form a first metal silicide 29 on top of the gate electrode 25 and in surfaces of the LDD regions 27. Then, the metal layer 28 which made no reaction is removed. N type impurity ions are injected heavily to form source/drain regions 30. As shown in FIG. 3F, an oxide film is deposited and etched back, to form second sidewall spacers 31 on both sides of the first sidewall spacers 26. As shown in FIG. 3G, a thick second metal layer 32 is deposited on an entire surface of the semiconductor substrate 21. The metal layer 32 may be formed thin with a thickness ranging 100~300Å. The first, and second metal layer 28 and 32 may be formed of titanium, nickel, or cobalt. As shown in FIG. 3H, a second metal silicide 33 is formed at a portion in contact with the first metal silicide 29 by thermal process. The source/drain regions 30 are activated by annealing thereafter.

A method for fabricating a semiconductor device in accordance with a second embodiment of the present invention will be explained.

Figure 4A:
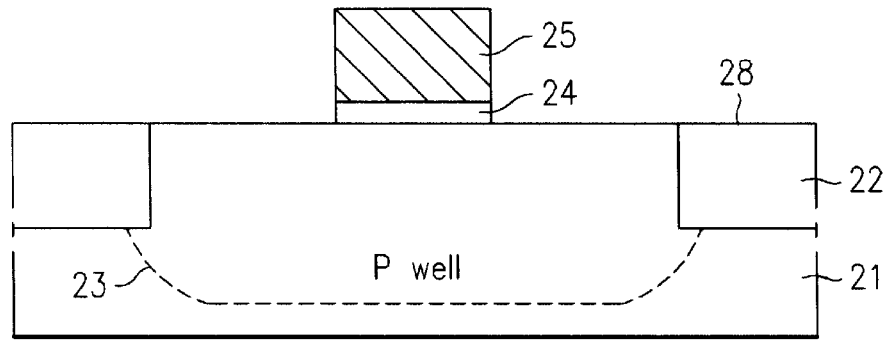
FIGS. 4A~4I illustrates sections showing the process steps of a method for fabricating a semiconductor device in accordance with a second preferred embodiment of the present invention; and, FIGS. 5A~5G illustrates sections showing the process steps of a method for fabricating a semiconductor device in accordance with a third preferred embodiment of the present invention.
Figure 4B:
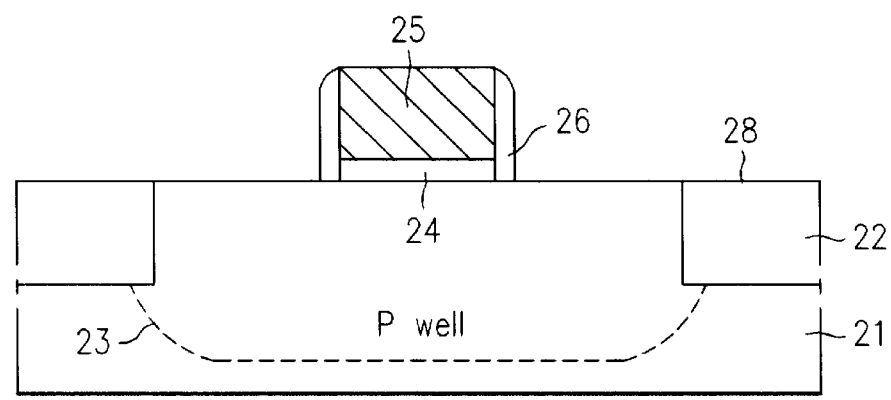
Figure 4C:
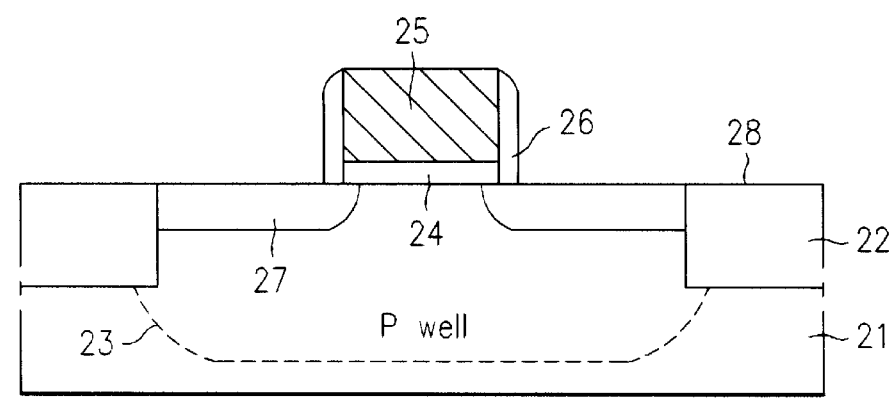
Figure 4D:
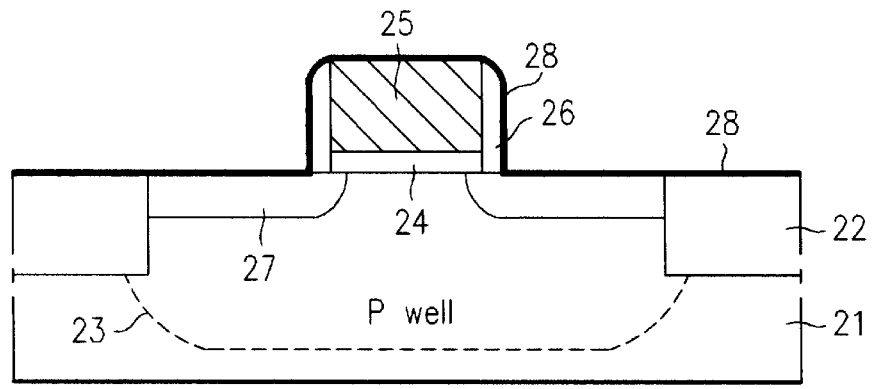
Figure 4E:
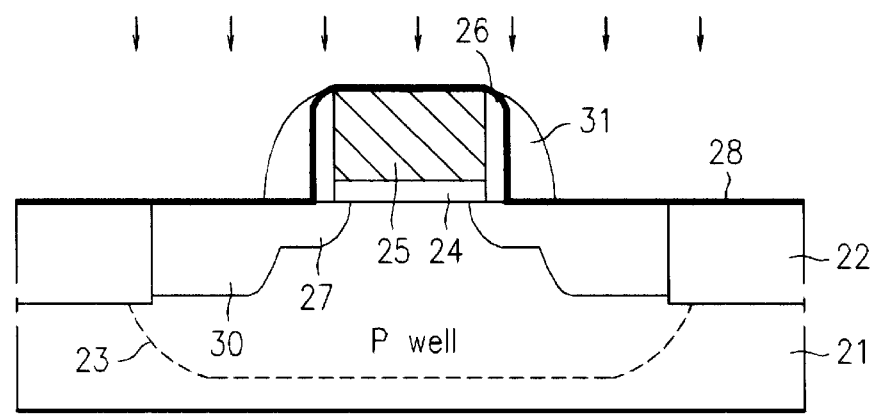
Figure 4F:
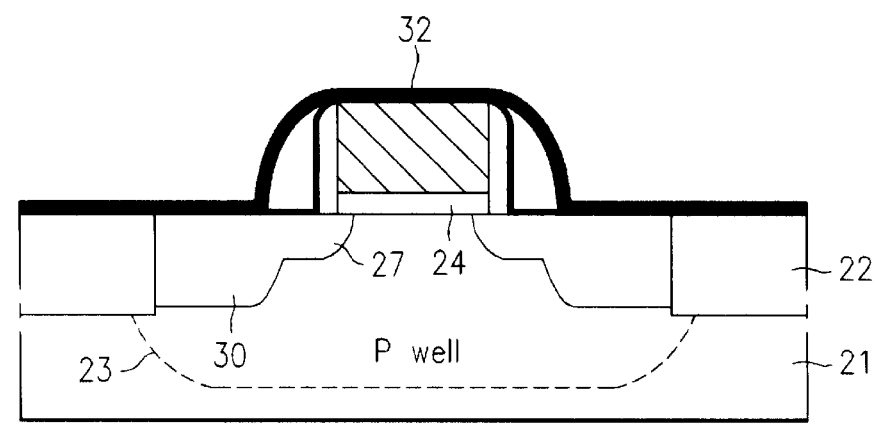
Figure 4G:
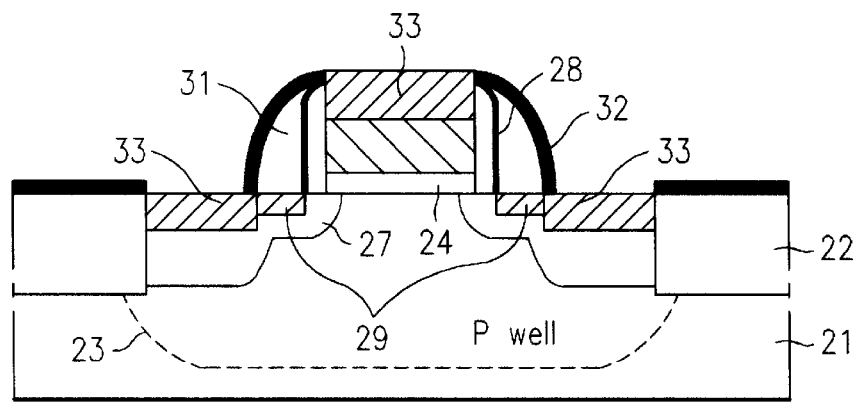
Figure 4H:
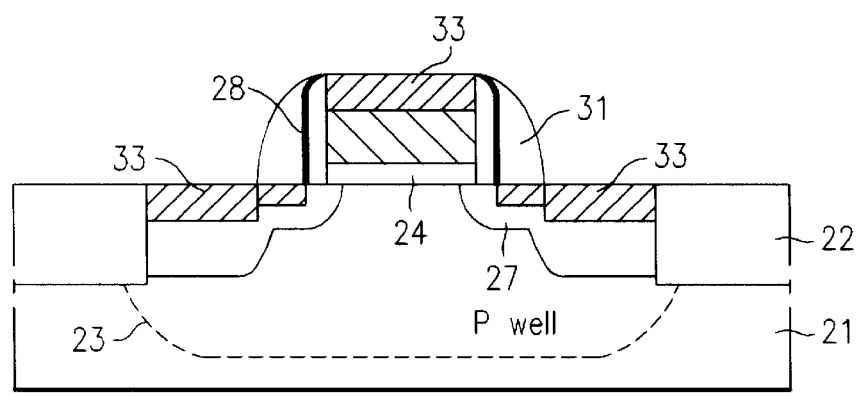
Figure 4I:
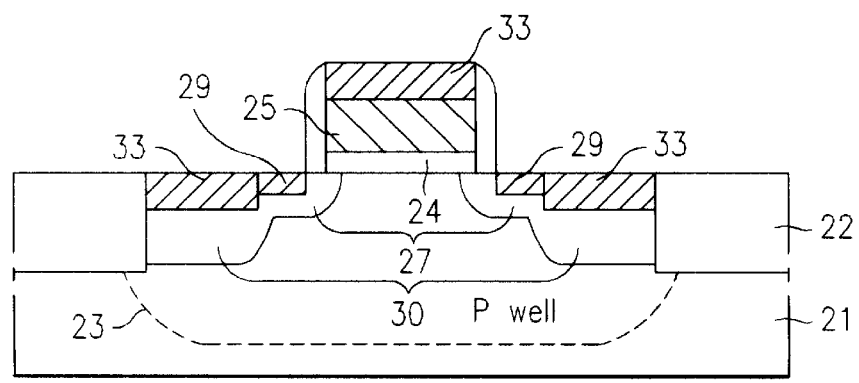

Fabricating steps shown in FIGS. 4A to 4E in this second embodiment are identical to the fabricating step shown in FIGS. 3A to 3E of the first embodiment. Next, as shown in FIG. 4E, a fourth oxide film is deposited on an entire surface and etched back to form second sidewall spacers 31 at both sides of the first metal layer 28 in contact with both sides of the first sidewall spacers 26. In this instance, the fourth oxide film is deposited and etched at a low temperature below 600° C. for preventing the first metal layer 28 from making reaction with the semiconductor substrate 21 or the gate electrode 25. Then, the semiconductor substrate 21 is heavily doped with N type impurity ions using the gate electrode 25 and the second sidewall spacers 31 as masks to form source/drain regions 30 therein. As shown in FIG. 4F, a thick second metal layer 32 is deposited on an entire surface, to a thickness of 300~500Å. The first, and second metal layers 28 and 32 are formed of titanium, nickel or cobalt. As shown in FIG. 4G, rapid thermal annealing is conducted to form first metal silicide 29 at interfaces of silicon with the first, and second metal layers 28 and 32. The annealing is conducted in one step or two steps. The first metal silicide 29 is formed on surfaces of the LDD regions 27, the source/drain regions 30 and the gate electrode 25. As shown in FIG. 4H, the first, and second metal layers 28 and 32 which are not converted into the first metal silicide 29 are removed by wet etching with $NH_4OH$. In this instance, the second metal layer 32 exposed on the isolating oxide film 22 or the second sidewall spacers 31 is etched at the first time. Then, as shown in FIG. 4I, the second sidewall spacers 31 are removed and the first metal layers 28 at sides of the first sidewall spacers 26 are removed. Then, the source/drain regions 30 are activated by a thermal process.

A method for fabricating a semiconductor device in accordance with a third embodiment of the present invention will be explained.

Figure 5A:
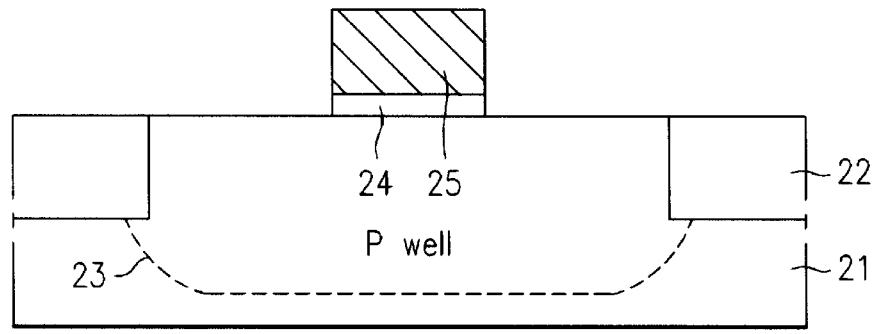
Figure 5B:
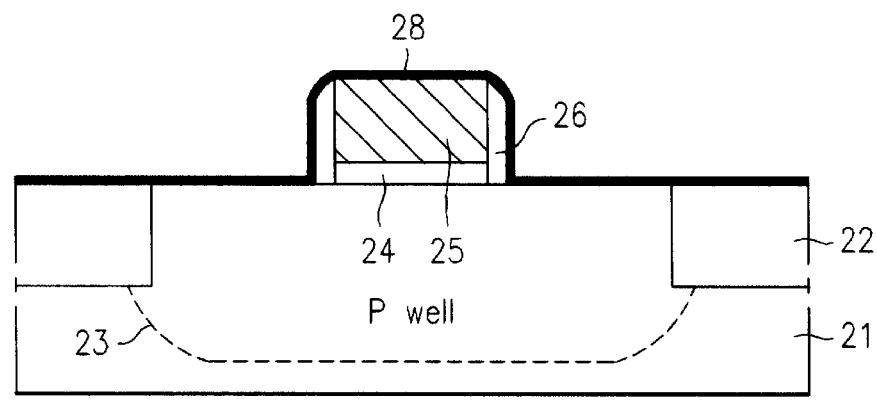
Figure 5C:
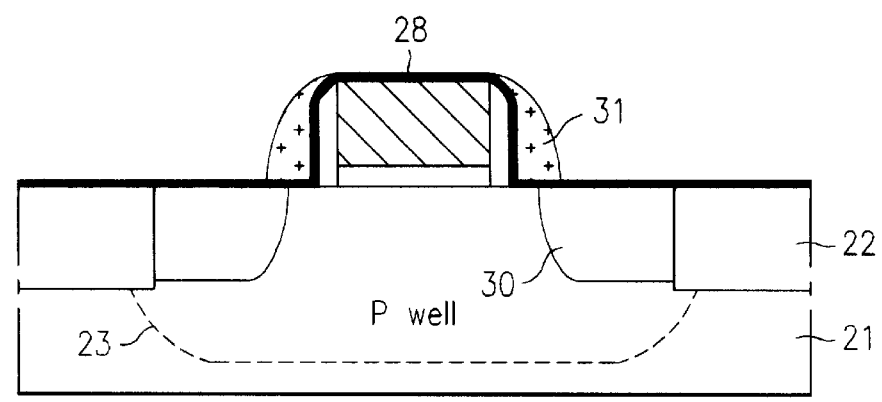

Referring to FIG. 5A, trenches are formed in field regions in an N type semiconductor substrate 21 having an active region and the field regions defined thereon(not shown in the drawing). A first oxide film is deposited on the semiconductor substrate 21 to cover the trenches and subjected to chemical mechanical polishing to make the first oxide film flat to the semiconductor substrate 21, to form an isolating insulating film 22. P type boron ions are injected into the active region to form a P well 23. Then, ions are injected into the P well in the active region for adjusting a channel threshold voltage. A second oxide film and a doped first polysilicon layer are deposited on an entire surface of the semiconductor substrate 21 and etched anisotropicially using a mask for forming gate, to form a gate oxide film 24 and a gate electrode 25. The silicon layer may be doped as it is deposited, or after completion of the deposition by injecting ions. As shown in FIG. 3B, after subjecting the semiconductor substrate 21 to thermal oxidation to form a thin film on an entire surface of the semiconductor substrate 21 or after depositing a thin third oxide film or a nitride film, the film is subjected to anisotropic etching, to form first sidewall spacers 26 at both sides of the gate oxide film 24 and the gate electrode 25 to a thickness ranging 100~500 Å. As shown in FIG. 5C, a thin metal layer 28 is deposited on an entire surface of the semiconductor substrate 21. And, a polysilicon layer which can be used as a doping source is deposited and etched back to form second sidewall spacers 31 at both sides of the first metal layer 28 which is in contact with the first sidewall spacers 26. In this instance, if the second sidewall spacers 31 are to be doped with P type impurities(in order to form an NMOS), a polysilicon layer doped with BSG(Boro-Silicate Glass) or boron is deposited, if the second sidewall spacers 31 are to be doped with N type impurities(in order to form a PMOS), a polysilicon layer doped with PSG(Phospho-Silicate Glass) is deposited. Or, after depositing undoped polysilicon, impurity ions may be doped and etched back, for use as a doping source.

Figure 5D:
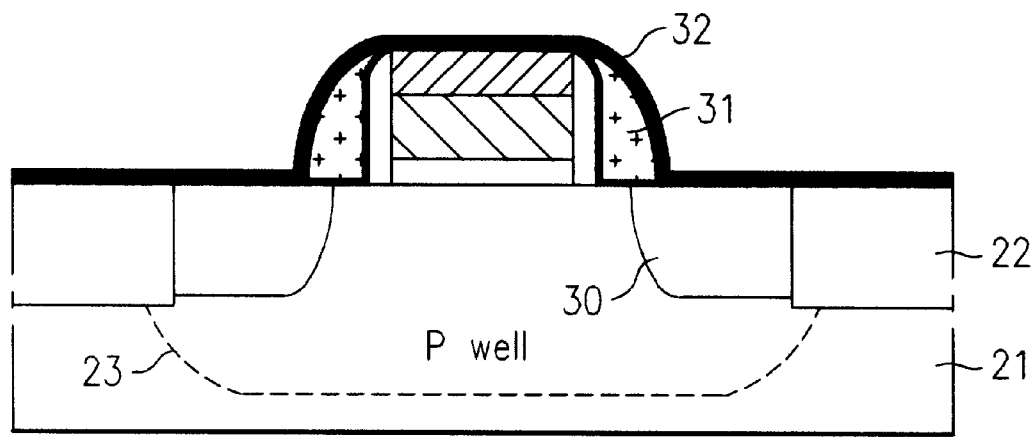
Figure 5E:
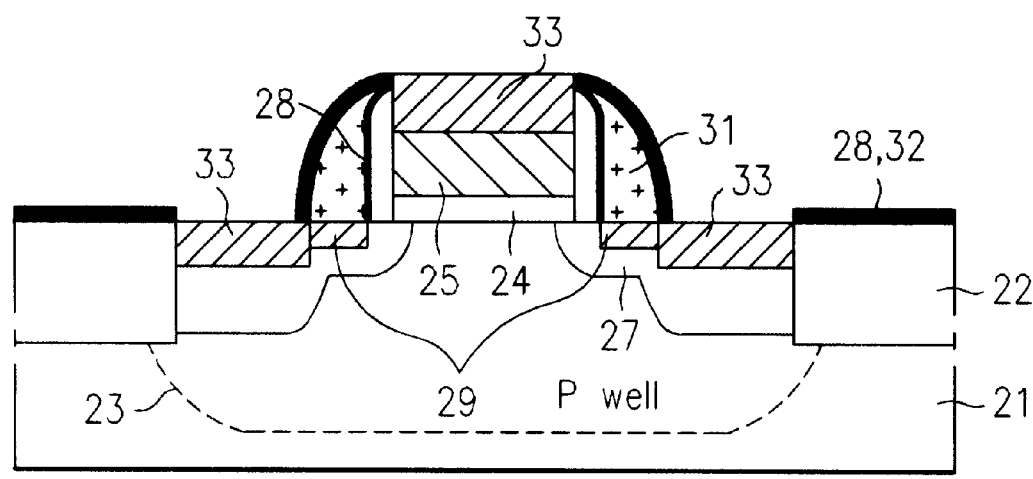
Figure 5F:
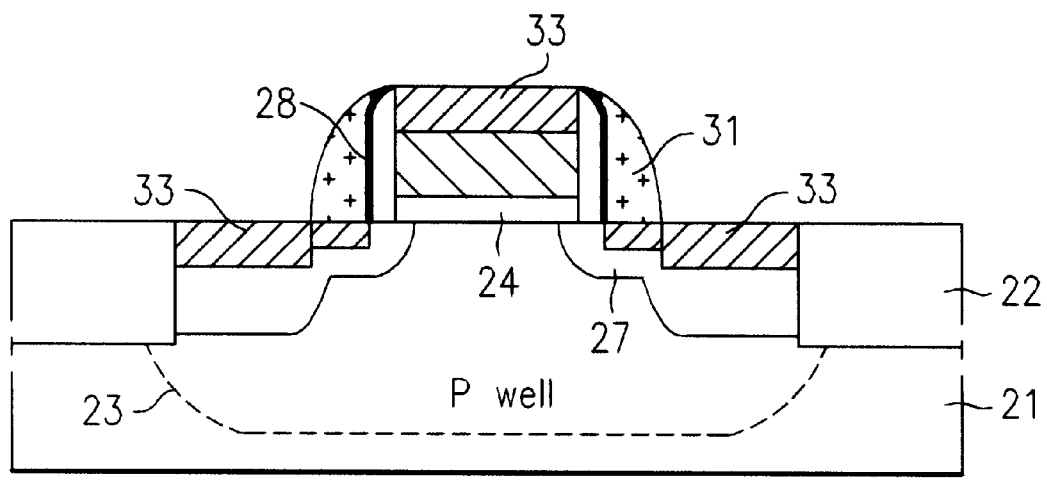
Figure 5G:
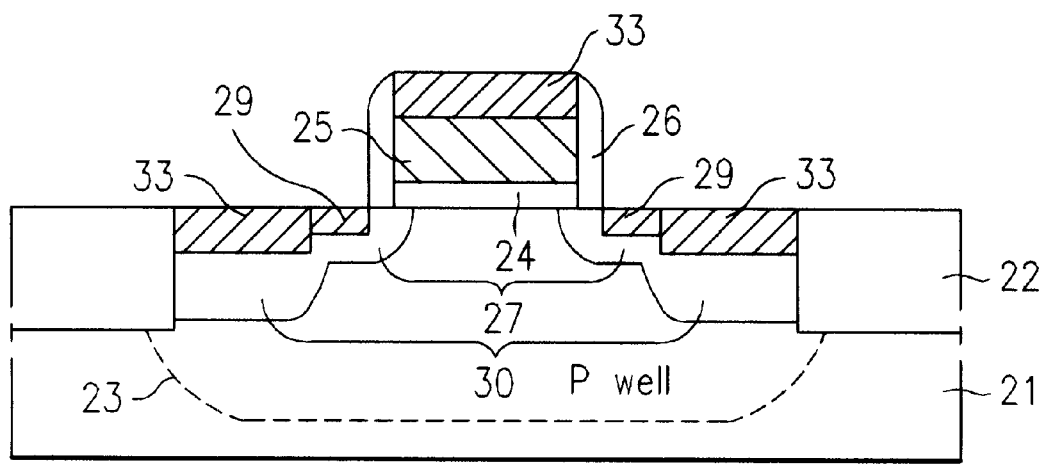

In this instance, it is desirable to use a fine grain polysilicon which has a fine grain polysilicon which has a fine grain size for good diffusion of the ions from the second sidewall spacers 31 to the semiconductor substrate 21. N type impurity ions are injected into the semiconductor substrate 21 on both side of the second sidewall spacers 31 to a prescribed depth to form source/drain regions 30. As shown in FIG. 5D, a thick second metal layer 32 is deposited on an entire surface of the semiconductor substrate 21. In this instance, the first, and second metal layers 28 and 32 may be formed of titanium, nickel, or cobalt. As shown in FIG. 5E, first metal silicide is formed in surfaces of the gate electrode 25, the source/drain regions 30 and the LDD regions 27 which are in contact with the silicon by annealing. The first metal silicide 29 is formed thin in the LDD regions 27 and deeper in the source/drain regions 30 than the first metal silicide 29 in the LDD regions 27. Thereafter, rapid thermal annealing is conducted to activate the source/drain regions 30. In this rapid thermal annealing for activating the source/drain regions 30, the ions doped in the second sidewall spacers 31 are diffused into a surface of the semiconductor substrate 21 through the first metal silicide 29 formed under the second sidewall spacers 31, to form LDD regions 27 therein. As shown in FIG. SF, the first, and second metal layers 28 and 32 which are not converted into the first metal silicide 29 are removed by wet etching with NH$_4$OH. In this instance, the second metal layer 32 exposed on the isolating oxide film 22 or the second sidewall spacers 31 is etched at the first time. Then, as shown in FIG. 5G, the second sidewall spacers 31 are removed and the first metal layers 28 at sides of the first sidewall spacers 31 are removed.

The semiconductor device and the method for fabricating a semiconductor device of the present invention have the following advantage.

The reduced resistance by providing a metal silicide both in the source/drain regions and the LDD regions prevents an increase of junction leakage current, that prevents the problem of short channel.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising the steps of:

forming a stack of gate insulting film and a gate electrode over a semiconductor substrate;

forming first sidewall spacers at both sides of the stack of the gate insulating film and the gate electrode;

forming first impurity regions using the first sidewall spacers as masks;

depositing a first metal layer on an entire surface;

annealing the first metal layer, to form first silicide films in surfaces of the first impurity regions and the gate electrode;

removing the first metal layer which made no reaction;

forming second sidewall spacers at sides of the first sidewall spacers at sides of the stack of the gate insulting film and the gate electrode;

forming source/drain regions in the semiconductor substrate using the second sidewall spacers as masks;

depositing a second metal layer on an entire surface;

conducting annealing to form second silicide films on the gate electrode and the source/drain regions; and, removing the second metal layer which made no reaction.

2. A method as claimed in claim 1, wherein the first, and second metal layers are formed of titanium, nickel, or cobalt.

3. A method as claimed in claim 1, wherein the first, and second metal layers are formed of metals different from each other.

4. A method as claimed in claim 1, wherein the first silicide film is formed thinner than the second silicide film.

5. A method for fabricating a semiconductor device, comprising the steps of:

forming a stack of gate insulting film and a gate electrode over a semiconductor substrate;

forming first sidewall spacers at both sides of the stack of the gate insulating film and the gate electrode;

forming first impurity regions using the first sidewall spacers as masks;

depositing a first metal layer on an entire surface;

forming second sidewall spacers on the first metal layer on the first sidewall spacers;

forming second impurity regions in the semiconductor substrate on both sides of the gate electrode and the second sidewall spacers;

forming a second metal layer on an entire surface of the semiconductor substrate;

conducting annealing to form first silicide films in the first impurity regions under the second sidewall spacers and to form second silicide films in surfaces of the gate electrode and the second impurity regions;

removing exposed second metal layer which made no reaction;

removing the second sidewall spacers; and, removing the first metal layer remained at sides of the first sidewall spacers.

6. A method as claimed in claim 5, wherein the first, and second metal layers are formed of titanium, nickel, or cobalt.

7. A method as claimed in claim 5, wherein the first, and second metal layers are formed of metals different from each other.

8. A method as claimed in claim 5, wherein the first silicide film is formed thinner than the second silicide film.

9. A method as claimed in claim 5, wherein the second sidewall spacers are formed at a temperature lower than 600° C.

10. A method for fabricating a semiconductor device, comprising the steps of:

forming a stack of gate insulting film and a gate electrode over a semiconductor substrate;

forming first sidewall spacers at both sides of the stack of the gate insulating film and the gate electrode;

depositing a first metal layer on an entire surface;

forming doped second sidewall spacers on the first metal layer on the first sidewall spacers;

forming first impurity regions in the semiconductor substrate on both sides of the gate electrode and the second sidewall spacers;

forming a second metal layer on an entire surface of the semiconductor substrate;

conducting annealing to form first silicide films at surfaces of the semiconductor substrate under the second sidewall spacers and to form second silicide films in surfaces of the gate electrode and the first impurity regions;

forming second impurity regions bounding the first silicide films from below by means of annealing conducted for activating the first impurity regions;

removing exposed second metal layer which made no reaction;

removing the second sidewall spacers; and, removing the first metal layer remained on the first sidewall spacers.

11. A method as claimed in claim 10, wherein the second sidewall spacers are formed of BSG(Boro-Silicate Glass) doped with boron, or polysilicon doped with boron.

12. A method as claimed in claim 10, wherein the second sidewall spacers are formed of PSG(Phospho-Silicate Glass) doped with phosphorus, or polysilicon doped with phosphorus.

13. A method as claimed in claim 10, wherein the first, and second metal layers are formed of titanium, nickel, or cobalt.

14. A method as claimed in claim 10, wherein the first, and second metal layers are formed of metals different from each other.

15. A method as claimed in claim 10, wherein the second silicide film is formed deeper than the first silicide film.

* * * * *